United States Patent
Martin

(10) Patent No.: US 7,869,186 B2
(45) Date of Patent: Jan. 11, 2011

(54) HIGH Q AND LOW STRESS CAPACITOR ELECTRODE ARRAY

(75) Inventor: James Martin, Londonderry, NH (US)

(73) Assignee: Paratek Microwave, Inc., Nashua, NH (US)

( * ) Notice: Subject to any disclaimer, the term of this patent is extended or adjusted under 35 U.S.C. 154(b) by 775 days.

(21) Appl. No.: 11/598,354

(22) Filed: Nov. 13, 2006

(65) Prior Publication Data

US 2007/0109716 A1    May 17, 2007

Related U.S. Application Data

(60) Provisional application No. 60/736,366, filed on Nov. 14, 2005.

(51) Int. Cl.
*H01G 4/005* (2006.01)
*H01G 4/06* (2006.01)

(52) U.S. Cl. ....................... 361/303; 361/311

(58) Field of Classification Search ......... 361/303–305, 361/311
See application file for complete search history.

(56) References Cited

U.S. PATENT DOCUMENTS

| 6,309,895 | B1 * | 10/2001 | Jaing et al. ..................... 438/3 |
| 6,452,776 | B1 * | 9/2002 | Chakravorty ................ 361/303 |
| 6,875,655 | B2 * | 4/2005 | Lin et al. ..................... 438/253 |
| 6,999,297 | B1 * | 2/2006 | Klee et al. .................. 361/303 |
| 2003/0071300 | A1 * | 4/2003 | Yashima et al. ............. 257/310 |

FOREIGN PATENT DOCUMENTS

JP    2000124066 A  *  4/2000

* cited by examiner

*Primary Examiner*—Eric Thomas
(74) *Attorney, Agent, or Firm*—Ed Guntin; Guntin Meles & Gust, PLC

(57) ABSTRACT

An embodiment of the present invention provides a capacitor, including a solid electrode, an electrode broken into subsections with a signal bus lines connecting the subsections; and wherein the signal bus further connects the solid electrode with the electrode broken into subsections.

11 Claims, 2 Drawing Sheets

HIGH Q AND LOW STRESS CAPACITOR ELECTRODE ARRAY

CROSS-REFERENCE TO RELATED APPLICATION

This application claims the benefit of priority under 35 U.S.C Section 119 from U.S. Provisional Application Ser. No. 60/736,366, filed Nov. 14, 2005, entitled, HIGH Q AND LOW STRESS CAPACITOR ELECTRODE ARRAY, by James Martin.

BACKGROUND OF THE INVENTION

One of the most important parameters in evaluating a high frequency chip capacitor is the Q factor, or the related equivalent series resistance (ESR). In theory, a "perfect" capacitor would exhibit an ESR of 0 (zero) ohms and would be purely reactive with no real (resistive) component. The current going through the capacitor would lead the voltage across the capacitor by exactly 90 degrees at all frequencies.

In real world usage, no capacitor is perfect, and will always exhibit some finite amount of ESR. The ESR varies with frequency for a given capacitor, and is "equivalent" because its source is from the characteristics of the conducting electrode structures and in the insulating dielectric structure. For the purpose of modeling, the ESR is represented as a single series parasitic element. In past decades, all capacitor parameters were measured at a standard of 1 MHz, but in today's high frequency world, this is far from sufficient. Typical values for a good high frequency capacitor of a given value could run in the order of about 0.05 ohms at 200 MHz, 0.11 ohms at 900 MHz, and 0.14 ohms at 2000 MHz.

The quality factor Q, is a dimensionless number that is equal to the capacitor's reactance divided by the capacitor's parasitic resistance (ESR). The value of Q changes greatly with frequency as both reactance and resistance change with frequency. The reactance of a capacitor changes tremendously with frequency or with the capacitance value, and therefore the Q value could vary by a great amount.

Since a high capacitor Q is vital to many applications, a strong industry need exists for the high Q and low stress capacitor electrode array of the present invention.

SUMMARY OF THE INVENTION

An embodiment of the present invention provides a capacitor, comprising a solid electrode, an electrode broken into subsections with a signal bus lines connecting the subsections; and wherein the signal bus further connects the solid electrode with the electrode broken into subsections. The capacitor of an embodiment of the present invention may further comprise a voltage tunable dielectric material between the solid electrode and the electrode broken into subsections to enable the capacitor to be voltage tunable. The broken electrode may distribute the signal across the capacitor area and increase the effective width of a signal path through the solid electrode. In an embodiment of the present invention and not limited in this respect, the capacitor may be a planar integrated capacitors or a discrete ceramic capacitor and the capacitor may be a pair of series capacitors and wherein the subsections are arranged in such a manner that it increases the effective width of the signal path in the solid electrode.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

An embodiment of the present invention provides a capacitor electrode structure that allows for the creation of very high "Q" (low resistance) capacitors. It is particularly well suited to common capacitor material structures wherein one electrode is made from a higher resistance metal than the opposite electrode. Examples of capacitors with such material properties can be found in planar integrated capacitors, as well as discrete ceramic capacitors. The structure of an embodiment of the present invention also reduces the mechanical stresses generated in the metals and dielectric films of the capacitor. The invention includes electrodes broken into subsections, signal bus lines to connect the subsections, and a solid electrode. The broken electrode should have the lower resistance of the two. The broken electrode may distribute the signal across the capacitor area and, through proper arrangement, increase the effective width of the signal path through the higher resistance solid electrode. The signal busses may bring in and take out the signal. Looking now at FIG. 1, in an embodiment of the present invention, the present electrodes may include a voltage tunable dielectric material 137 between the electrodes and the voltage tunable dielectric material may be a Parascan® voltage tunable dielectric material.

This structure realizes these benefits by breaking two of the electrodes of a pair of series capacitors into subsections. The sections are arranged in such a manner that it increases the effective width of the signal path in the higher resistance electrode. These subsections are then electrically connected through signal bus line. The reduction in stress occurs because the individual electrode subsections retain and create less stress than a single plate of similar area.

Figure 1:
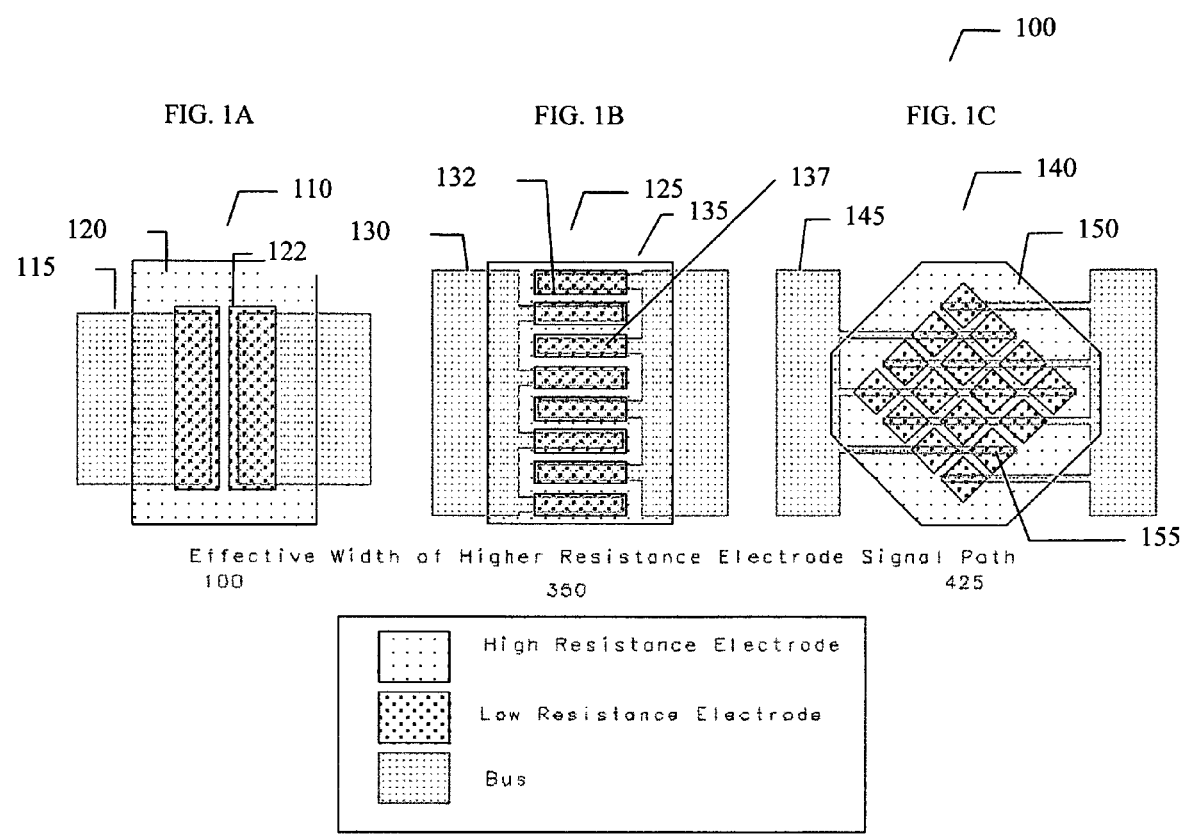
FIG. 1 illustrates three, of many possible, capacitor electrode structures of some embodiments of the present invention.

Continuing with FIG. 1, shown generally as 100 are images of two series capacitors. The left most, FIG. 1A, design 110 is fairly standard with solid high resistance electrode 120 and low resistance electrodes 122 connected by signal bus lines 115. Although not limited in this respect, two exemplary embodiments of the present invention are shown in the center 125 and on the right 140. Center capacitor, FIG. 1B 125, may include solid high resistance electrode 135 and low resistance electrodes 132 connected by bus 130. Right capacitor, FIG. 1C 140, may include solid high resistance electrode 150 and low resistance electrodes 155 connected by signal bus lines 145. The reduction in resistance, leading to an increase in Q, occurs because the length of the signal path stays the same while the effective width increases. For example, breaking the electrode as shown in the middle image 125 increases the width to 3.5 times that of the conventional capacitor. The rightmost "diamond" configuration 140 increases that width to 4.25 times that of the conventional.

Figure 2:
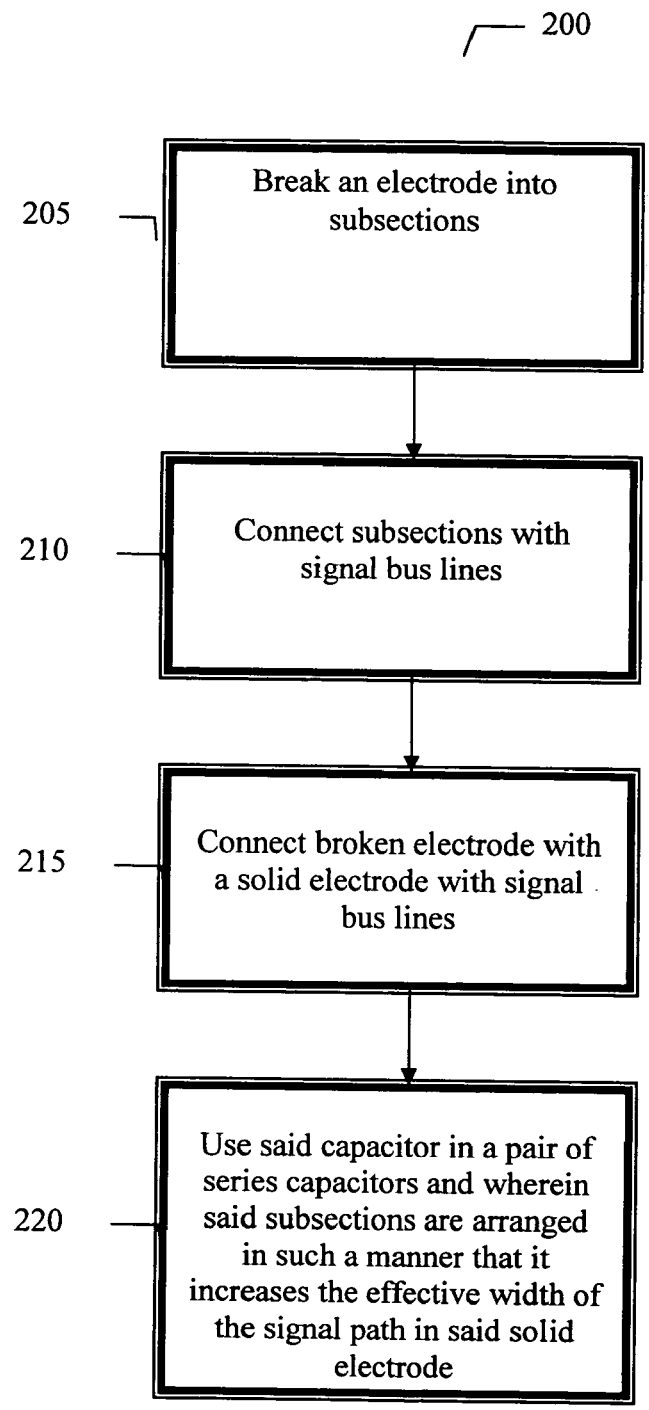
FIG. 2 illustrates a method of one embodiment of the present invention.

Turning now to FIG. 2, generally at 200, is provided a method according to one embodiment of the present invention which may comprise breaking an electrode into subsections 205 with signal bus lines connecting said subsections 210 and a solid electrode 215 to improve Q. The method may further comprise distributing the signal across said capacitor area by said broken electrode and thereby increasing the effective width of a signal path through said solid electrode. The capacitor may be a planar integrated capacitor or a discrete ceramic capacitor in the method of an embodiment of the present invention. The method may still further comprise adapting said solid electrode and said broken electrode to reduce the mechanical stresses generated in the metals and dielectric films of said capacitor and as shown at 220 using said capacitor in a pair of series capacitors and wherein said subsections are arranged in such a manner that it increases the effective width of the signal path in said solid electrode. In an embodiment of the present method the at least one voltage tunable dielectric capacitor may be a series network of voltage tunable dielectric capacitors which are all tuned using a common tuning voltage.

Throughout the aforementioned description, BST may be used as a tunable dielectric material that may be used in a tunable dielectric capacitor of the present invention. However, the assignee of the present invention, Paratek Microwave, Inc. has developed and continues to develop tunable dielectric materials that may be utilized in embodiments of the present invention and thus the present invention is not limited to using BST material. This family of tunable dielectric materials may be referred to as Parascan®.

The term Parascan® as used herein is a trademarked term indicating a tunable dielectric material developed by the assignee of the present invention. Parascan® tunable dielectric materials have been described in several patents. Barium strontium titanate (BaTiO3-SrTiO3), also referred to as BSTO, is used for its high dielectric constant (200-6,000) and large change in dielectric constant with applied voltage (25-75 percent with a field of 2 Volts/micron). Tunable dielectric materials including barium strontium titanate are disclosed in U.S. Pat. No. 5,312,790 to Sengupta, et al. entitled "Ceramic Ferroelectric Material"; U.S. Pat. No. 5,427,988 by Sengupta, et al. entitled "Ceramic Ferroelectric Composite Material-BSTO-MgO"; U.S. Pat. No. 5,486,491 to Sengupta, et al. entitled "Ceramic Ferroelectric Composite Material-BSTO-ZrO2"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO-ZnO"; U.S. Pat. No. 6,074,971 by Chiu et al. entitled "Ceramic Ferroelectric Composite Materials with Enhanced Electronic Properties BSTO Mg Based Compound-Rare Earth Oxide". These patents are incorporated herein by reference. The materials shown in these patents, especially BSTO-MgO composites, show low dielectric loss and high tunability. Tunability is defined as the fractional change in the dielectric constant with applied voltage.

Barium strontium titanate of the formula $Ba_xSr_{1-x}TiO_3$ is a preferred electronically tunable dielectric material due to its favorable tuning characteristics, low Curie temperatures and low microwave loss properties. In the formula $Ba_xSr_{1-x}TiO_3$, x can be any value from 0 to 1, preferably from about 0.15 to about 0.6. More preferably, x is from 0.3 to 0.6.

Other electronically tunable dielectric materials may be used partially or entirely in place of barium strontium titanate. An example is $Ba_xCa_{1-x}TiO_3$, where x is in a range from about 0.2 to about 0.8, preferably from about 0.4 to about 0.6. Additional electronically tunable ferroelectrics include $Pb_xZr_{1-x}TiO_3$ (PZT) where x ranges from about 0.0 to about 1.0, $Pb_xZr_{1-x}SrTiO_3$ where x ranges from about 0.05 to about 0.4, $KTa_xNb_{1-x}O_3$ where x ranges from about 0.0 to about 1.0, lead lanthanum zirconium titanate (PLZT), $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)5KH_2PO_4$, and mixtures and compositions thereof. Also, these materials can be combined with low loss dielectric materials, such as magnesium oxide (MgO), aluminum oxide ($Al_2O_3$), and zirconium oxide ($ZrO_2$), and/or with additional doping elements, such as manganese (MN), iron (Fe), and tungsten (W), or with other alkali earth metal oxides (i.e. calcium oxide, etc.), transition metal oxides, silicates, niobates, tantalates, aluminates, zirconnates, and titanates to further reduce the dielectric loss.

In addition, the following U.S. patents and patent Applications, assigned to the assignee of this application, disclose additional examples of tunable dielectric materials: U.S. Pat. No. 6,514,895, entitled "Electronically Tunable Ceramic Materials Including Tunable Dielectric and Metal Silicate Phases"; U.S. Pat. No. 6,774,077, entitled "Electronically Tunable, Low-Loss Ceramic Materials Including a Tunable Dielectric Phase and Multiple Metal Oxide Phases"; U.S. Pat. No. 6,737,179 filed Jun. 15, 2001, entitled "Electronically Tunable Dielectric Composite Thick Films And Methods Of Making Same; U.S. Pat. No. 6,617,062 entitled "Strain-Relieved Tunable Dielectric Thin Films"; U.S. Pat. No. 6,905,989, filed May 31, 2002 entitled "Tunable Dielectric Compositions Including Low Loss Glass"; U.S. patent application Ser. No. 10/991,924, filed Nov. 18, 2004 entitled "Tunable Low Loss Material Compositions and Methods of Manufacture and Use Therefore" These patents and patent applications are incorporated herein by reference.

The tunable dielectric materials can also be combined with one or more non-tunable dielectric materials. The non-tunable phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$. The non-tunable dielectric phases may be any combination of the above, e.g., MgO combined with $MgTiO_3$, MgO combined with MgSrZrTiO$_6$, MgO combined with Mg$_2$SiO$_4$, MgO combined with Mg$_2$SiO$_4$, Mg$_2$SiO$_4$ combined with CaTiO$_3$ and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include CaZrO$_3$, BaZrO$_3$, SrZrO$_3$, BaSnO$_3$, CaSnO$_3$, MgSnO$_3$, Bi2O$_3$/2SnO$_2$, Nd$_2$O$_3$, Pr$_7$O$_{11}$, Yb$_2$O$_3$, H$_{o2}$O$_3$, La$_2$O$_3$, MgNb$_2$O$_6$, SrNb$_2$O$_6$, BaNb$_2$O$_6$, MgTa$_2$O$_6$, BaTa$_2$O$_6$ and Ta$_2$O$_3$.

Films of tunable dielectric composites may comprise Ba1-xSrxTiO3, where x is from 0.3 to 0.7 in combination with at least one non-tunable dielectric phase selected from MgO, MgTiO$_3$, MgZrO$_3$, MgSrZrTiO$_6$, Mg$_2$SiO$_4$, CaSiO$_3$, MgAl$_2$O$_4$, CaTiO$_3$, Al$_2$O$_3$, SiO$_2$, BaSiO$_3$ and SrSiO$_3$. These compositions can be BSTO and one of these components, or two or more of these components in quantities from 0.25 weight percent to 80 weight percent with BSTO weight ratios of 99.75 weight percent to 20 weight percent.

The electronically tunable materials may also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include Mg$_2$SiO$_4$, CaSiO$_3$, BaSiO$_3$ and SrSiO$_3$. In addition to Group 2A metals, the present metal silicates may include metals from Group 1A, i.e., Li, Na, K, Rb, Cs and Fr, preferably Li, Na and K. For example, such metal silicates may include sodium silicates such as Na$_2$SiO$_3$ and NaSiO$_3$—5H$_2$O, and lithium-containing silicates such as LiAlSiO$_4$, Li2SiO$_3$ and Li$_4$SiO$_4$. Metals from Groups 3A, 4A and some transition metals of the Periodic Table may also be suitable constituents of the metal silicate phase. Additional metal silicates may include Al$_2$Si$_2$O$_7$, ZrSiO$_4$, Ka1Si$_3$O$_8$, NaAlSi$_3$O$_8$, CaAl$_2$Si$_2$O$_8$, CaMgSi$_2$O$_6$, BaTiSi$_3$O$_9$ and Zn$_2$SiO$_4$. The above tunable materials can be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides. Preferred additional metal oxides include Mg$_2$SiO$_4$, MgO, CaTiO$_3$, MgZrSrTiO$_6$, MgTiO$_3$, MgA$_{12}$O$_4$, WO3, SnTiO$_4$, ZrTiO$_4$, CaSiO$_3$, CaSnO$_3$, CaWO$_4$, CaZrO$_3$, MgTa$_2$O$_6$, MgZrO$_3$, MnO$_2$, PbO, Bi$_2$O$_3$ and LaO$_3$. Particularly preferred additional metal oxides include Mg$_2$SiO$_4$, MgO, CaTiO$_3$, MgZrSrTiO$_6$, MgTiO$_3$, MgAl$_2$O$_4$, MgTa$_2$O$_6$ and MgZrO$_3$.

The additional metal oxide phases are typically present in total amounts of from about 1 to about 80 weight percent of the material, preferably from about 3 to about 65 weight percent, and more preferably from about 5 to about 60 weight percent. In one preferred embodiment, the additional metal oxides comprise from about 10 to about 50 total weight percent of the material. The individual amount of each additional metal oxide may be adjusted to provide the desired properties. Where two additional metal oxides are used, their weight ratios may vary, for example, from about 1:100 to about 100:1, typically from about 1:10 to about 10:1 or from about 1:5 to about 5:1. Although metal oxides in total amounts of from 1 to 80 weight percent are typically used, smaller additive amounts of from 0.01 to 1 weight percent may be used for some applications.

The additional metal oxide phases can include at least two Mg-containing compounds. In addition to the multiple Mg-containing compounds, the material may optionally include Mg-free compounds, for example, oxides of metals selected from Si, Ca, Zr, Ti, Al and/or rare earths.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. An apparatus, comprising:
   a capacitor including a solid electrode; and
   an electrode broken into subsections with signal bus lines connecting said subsections such that the length of a signal path stays the same while an effective width increases thereby creating a reduction in resistance, leading to an increase in Q;
   wherein said broken electrode is constructed of a lower resistance metal than said solid electrode and wherein a voltage tunable dielectric material is between said electrodes; and
   wherein the voltage tunable dielectric material is a series network of voltage tunable dielectric capacitors which are all tuned using a common tuning voltage.

2. The apparatus of claim 1, wherein said solid electrode and said broken electrode are adapted to reduce the mechanical stresses generated in metals and dielectric films of said capacitor.

3. The apparatus of claim 1, wherein said subsections form a diamond shape.

4. The apparatus of claim 1, wherein said subsections form a plurality of adjacent rectangular shapes.

5. A capacitor, comprising:
   a solid electrode;
   an electrode broken into subsections with signal bus lines connecting said subsections such that the length of a signal path stays the same while an effective width increases thereby creating a reduction in resistance, leading to an increase in Q;
   wherein said broken electrode is constructed of a lower resistance metal than said solid electrode and wherein a voltage tunable dielectric material is between said electrodes;
   said capacitor is in a pair of series capacitors and wherein said subsections are arranged in such a manner that it increases the effective width of the signal path in said solid electrode; and
   wherein said pair of series capacitors is a series network of voltage tunable dielectric capacitors which are all tuned using a common tuning voltage.

6. The capacitor of claim 5, wherein said broken electrode distributes the signal across an area of said capacitor and increases the effective width of a signal path through said solid electrode.

7. A capacitor, comprising:

a first electrode;

a second electrode comprising a plurality of subsections connected via signal bus lines, wherein a change of dimensions of a signal path over a length of the signal path creates a reduction in resistance and an increase in Q, wherein the second electrode comprises a lower resistance metal than the first electrode and wherein a voltage tunable dielectric material is between the first and second electrodes;

wherein said capacitor is in a pair of series capacitors and wherein said subsections are arranged in such a manner that it increases the effective width of the signal path in said first electrode; and wherein said pair of series capacitors is a series network of voltage tunable dielectric capacitors which are all tuned using a common tuning voltage.

8. The capacitor of claim 7, wherein said subsections form a diamond shape.

9. The capacitor of claim 7, wherein said subsections form a plurality of adjacent rectangular shapes.

10. The capacitor of claim 7, wherein the first electrode is adapted to reduce the mechanical stresses generated in metals and dielectric films of the capacitor.

11. The capacitor of claim 7, wherein the second electrode is adapted to reduce the mechanical stresses generated in metals and dielectric films of the capacitor.

* * * * *